United States Patent [19]

Sawada et al.

[11] Patent Number: 5,726,475

[45] Date of Patent: *Mar. 10, 1998

[54] SEMICONDUCTOR DEVICE HAVING DIFFERENT IMPURITY CONCENTRATION WELLS

[75] Inventors: Shizuo Sawada, Yokohama; Syuso Fujii, Kawasaki; Masaki Ogihara, Yokohama, all of Japan

[73] Assignee: Kabushiki Kaisha Toshiba, Kawasaki, Japan

[*] Notice: The term of this patent shall not extend beyond the expiration date of Pat. No. 5,079,613.

[21] Appl. No.: 306,965

[22] Filed: Sep. 16, 1994

Related U.S. Application Data

[60] Continuation of Ser. No. 949,972, Sep. 24, 1992, Pat. No. 5,374,830, which is a division of Ser. No. 928,527, Aug. 12, 1992, Pat. No. 5,260,226, which is a continuation of Ser. No. 721,873, Aug. 8, 1991, abandoned, which is a division of Ser. No. 609,076, Nov. 7, 1990, Pat. No. 5,079,613, which is a continuation of Ser. No. 216,045, Jul. 7, 1988, abandoned.

[30] Foreign Application Priority Data

Jul. 10, 1987 [JP] Japan ................................ 62-172231

[51] Int. Cl.⁶ ............................. H01L 29/76; H01L 29/94; H01L 31/062; H01L 31/113
[52] U.S. Cl. ................................. 257/369; 257/371
[58] Field of Search ................................. 257/369, 371

[56] References Cited

U.S. PATENT DOCUMENTS

| | | |
|---|---|---|
| 4,233,672 | 11/1980 | Suzuki . |
| 4,413,401 | 11/1983 | Klein et al. . |
| 4,642,667 | 2/1987 | Magee . |
| 4,672,410 | 6/1987 | Miura et al. . |
| 4,673,962 | 6/1987 | Chaterjee et al. . |
| 5,079,613 | 1/1992 | Sawada et al. . |

FOREIGN PATENT DOCUMENTS

| | | |
|---|---|---|
| 0159824 | 10/1985 | European Pat. Off. . |
| 55-160463 | 12/1980 | Japan . |
| 60-143665 | 7/1985 | Japan . |
| 60-200568 | 10/1985 | Japan . |
| 61-97860 | 6/1986 | Japan . |

OTHER PUBLICATIONS

"An Experimental 4Mb CMOS Dram", Furuyama et al., 1966 IEEE International Solid–State Circuits Conference, ISSCC 86/Feb. 21, 1986.

"An Experimental 1–Mbit BiCMOS DRAM", Kitsukawa et al., IEEE Journal of Solid–State Circuits, vol. SC–22, No. 5, Oct. 1987.

"Advanced BiCMOS Technology for High Speed VLSI", Ikeda et al., IEDM 86, IEEE 1986.

"Bipolar CMOS Merged Structure for High Speed M Bit DRAM", Kobayashi et al., IEDM 86, IEEE 1986.

(List continued on next page.)

Primary Examiner—Stephen Meier
Attorney, Agent, or Firm—Finnegan, Henderson, Farabow, Garrett & Dunner, L.L.P.

[57] ABSTRACT

A semiconductor device comprises an N-type semiconductor substrate, a first P-type well formed in the semiconductor substrate, a second P-type well formed adjacent to the first P-type well in the semiconductor substrate, the surface impurity concentration of the second P-type well being set lower than that of the first P-type well, a DRAM memory cell structure formed in the first P-type well, and an MOS transistor structure formed in the second P-type well to function in combination with the memory cell structure.

10 Claims, 12 Drawing Sheets

OTHER PUBLICATIONS

"Physics and Technology of Semiconductor Devices", A.S. Grove, Fairchild Semiconductor, John Wiley & Sons, Inc., p. 209.

"Physics of Semiconductor Devices", S.M. Sze, John Wiley & Sons, pp. 192—(Abstract of Japanese Patent No. 58–7860, Jan. 17, 1983).

Patent Abstracts of Japan, vol. 7, No. 80 (E–168) (1225), Apr. 2, 1983 Solid–State Circuits Conference, ISSCC 86/Feb. 21, 1986.

Patent Abstracts of Japan, vol. 7, No. 40 (E–159) (1185), Feb. 17, 1983 (Abstract of Japanese Patent No. 57–192070, Nov. 26, 1982).

Patent Abstracts of Japan, vol. 7, No. 65 (E–165) (1210), Mar. 18, 1983 (Abstract of Japanese Patent No. 57–210665, Dec. 24, 1982).

Kobayashi et al., International Electron Device Meeting, Dec. 1986, pp. 802–804.

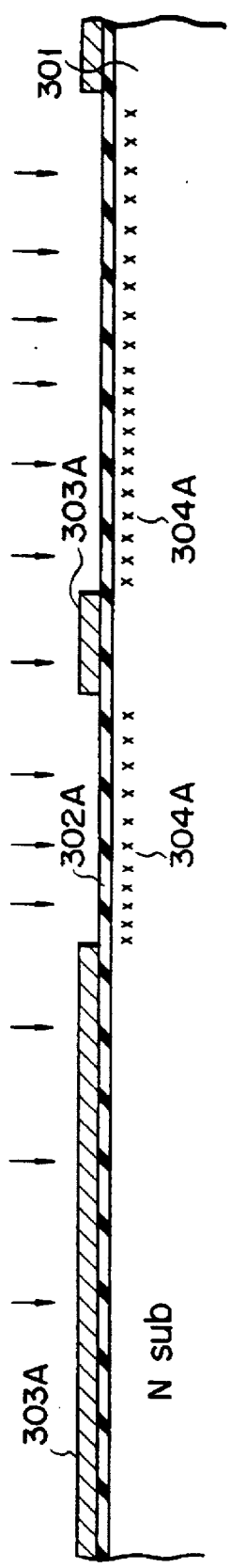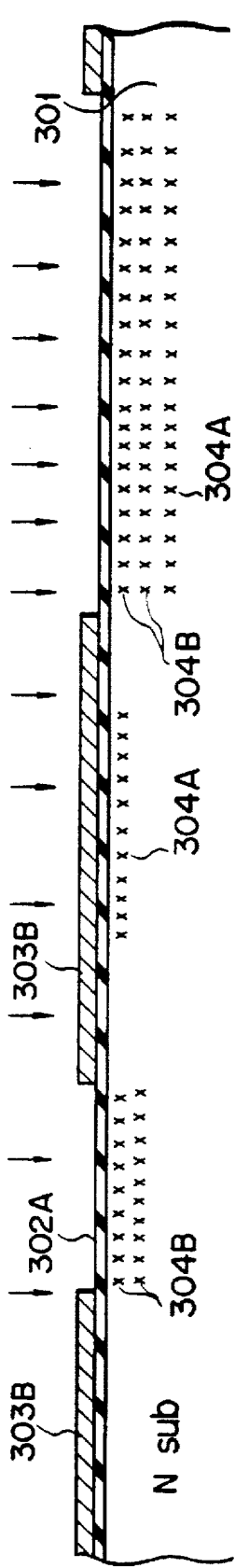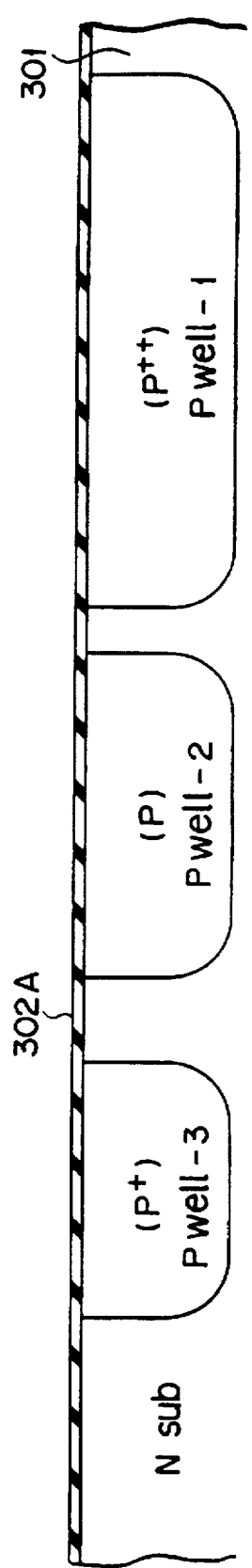

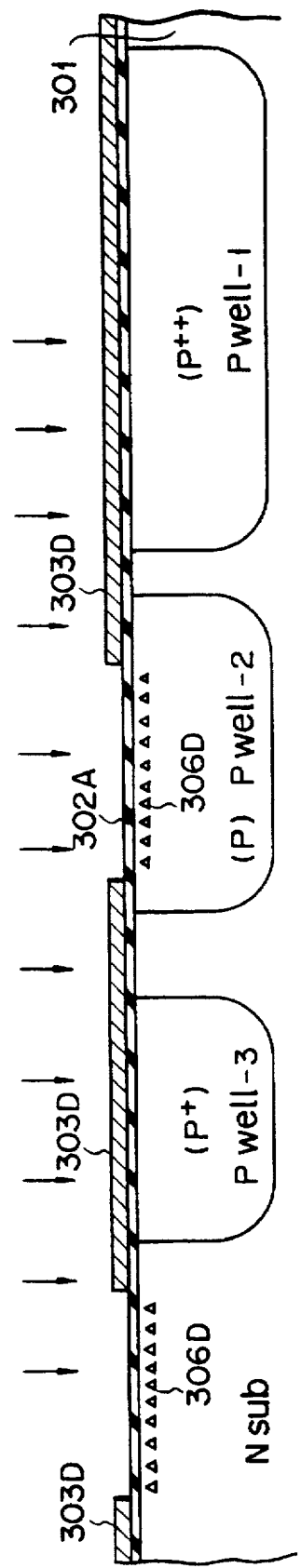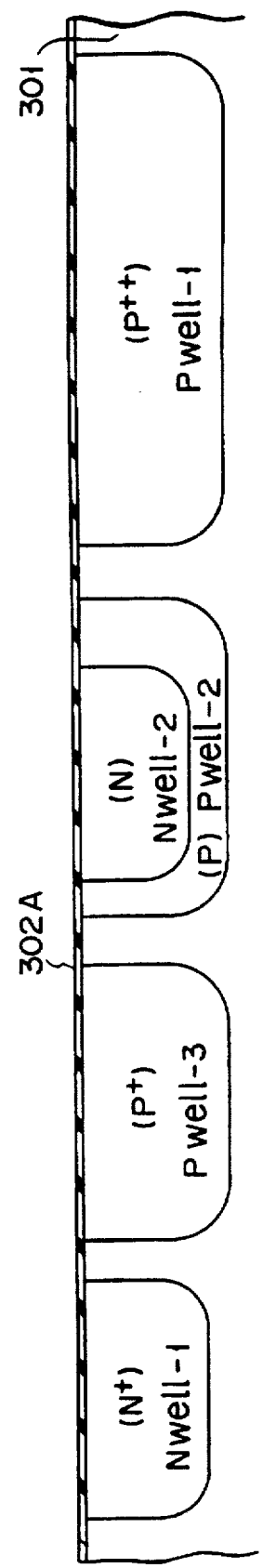

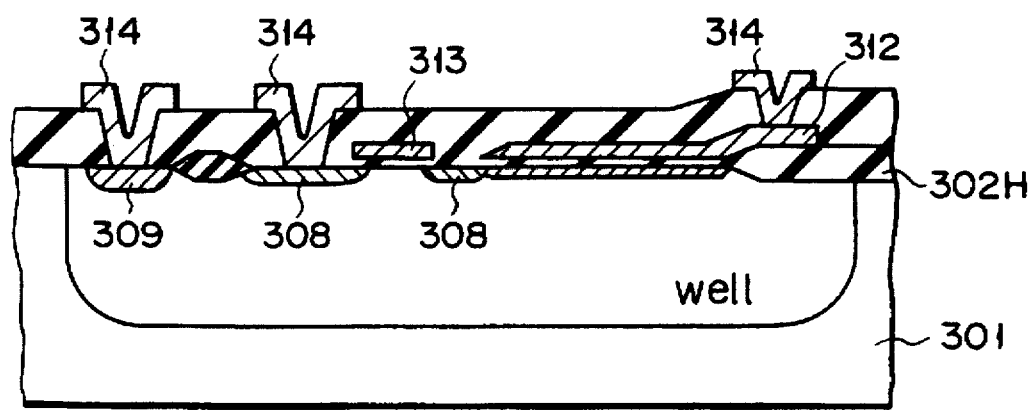
F I G. 13
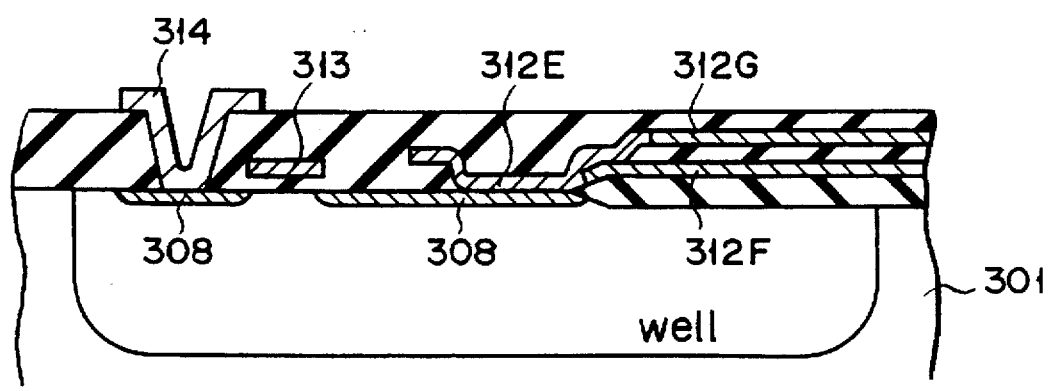
F I G. 14

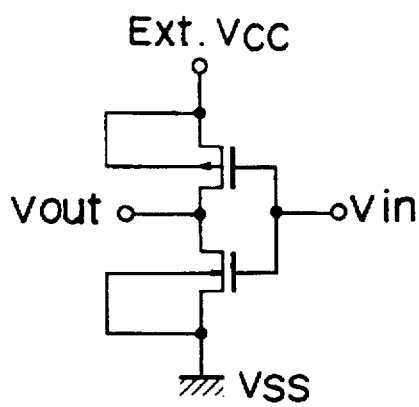
F I G. 15A
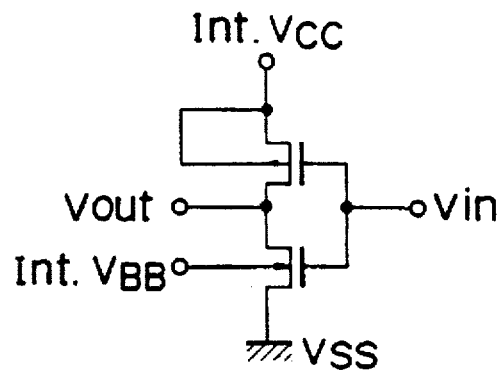
F I G. 15B
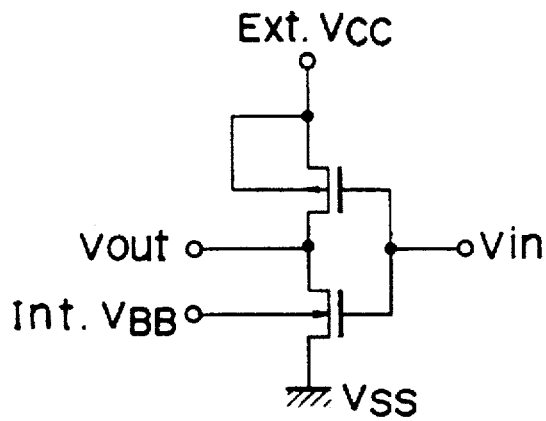
F I G. 15C
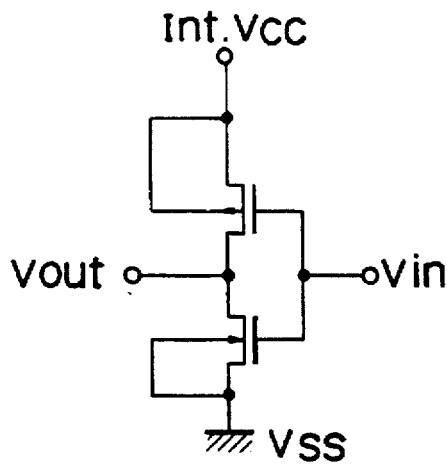
F I G. 15D
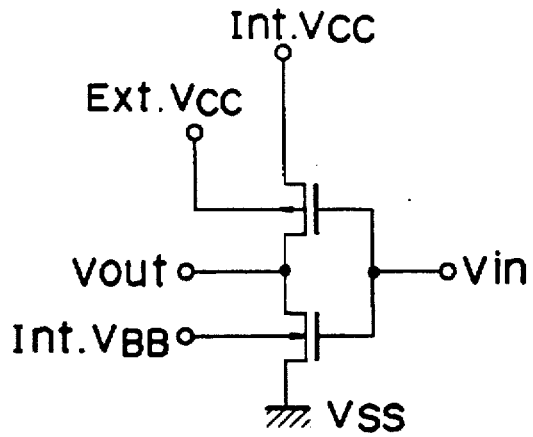
F I G. 15E

_5,726,475_

1

SEMICONDUCTOR DEVICE HAVING DIFFERENT IMPURITY CONCENTRATION WELLS

This application is a continuation of application Ser. No. 07/949,972, filed Sep. 24, 1992, now U.S. Pat No. 5,374,830, which is a divisional application of application Ser. No. 07/928,527 filed Aug. 12, 1992, now U.S. Pat. No. 5,260,226 which is a continuation application of Ser. No. 07/721,873, filed Aug. 8, 1991, now abandoned, which is a divisional application of Ser. No. 07/609,076, filed Nov. 7, 1990, which issued as U.S. Pat. No. 5,079,613, which is a continuation of Ser. No. 07/216,045, filed Jul. 7, 1988, now abandoned.

BACKGROUND OF THE INVENTION

1. Field of the Invention

This invention relates to a semiconductor memory with well structure, and more particularly to a dynamic random access memory (DRAM) with CMOS structure.

2. Description of the Related Art

In the conventional DRAM, CMOS structure has not been employed to constitute the peripheral circuit of the memory cell array. Recently, however, use of DRAMs with CMOS structure is growing.

FIG. 1 shows an example of the cross section of a one-transistor/one-capacitor type DRAM with CMOS structure. In FIG. 1, 1 denotes a P-type Si body; 2 and 2*, P-wells formed in the same manufacturing step; 3, an N-well; 4, an insulation film for a capacitor; 5, a capacitor electrode; 6, the gate insulation film of a transistor; 7, the gate electrode of a transistor; 8 and 8*, $N^+$-type diffusion layers (source, drain); 9, $P^+$-type diffusion layers (source, drain); 10, an insulation film; 11, an Al wiring layer; A, a memory cell section; and B, the peripheral circuit thereof. P-well layer 2 is formed to have an impurity concentration higher than that of P-type substrate 1.

Recently, it was found preferable to form a memory cell in a high impurity concentration well in order to prevent a soft error.

In a conventional memory device, the impurity concentration of P-well 2*, in which the memory cell is formed, is the same as that of P-well 2, in which the peripheral circuit is formed. Therefore, it becomes necessary to further increase the impurity concentration of the well for the memory cell in order to suppress the soft error. From the circuit characteristic point of view, it is not desirable to excessively increase the impurity concentration of the well because it will increase the diffusion capacitance between $N^+$-type layer 8* and P-well 2* and lower the junction breakdown voltage. If the miniaturization technique of the IC internal structure is further advanced, it becomes necessary to operate the internal circuit on a voltage of 2 to 4 V, despite the fact that the input/output circuit section of the IC is operated on a voltage of 5 V. Thus, it becomes necessary to adequately change the impurity concentration of the well, such as P-wells 2 and 2*, according to the difference in the power source voltages. However, no practical technology has developed to meet the requirement.

SUMMARY OF THE INVENTION

An object of this invention is to provide a semiconductor device which can improve the trade-off between the soft error and the withstanding voltage by utilizing different impurity concentration wells.

2

One of the features of this invention is that a plurality of wells of the same conductivity type with different surface impurity concentrations are formed in the semiconductor body and a memory cell or cells are formed in that one of the wells which has the highest surface impurity concentration.

Further, this invention has a second feature that first wells of a first conductivity type (P) are formed in the semiconductor body (P or N), a first well of a second conductivity type (N) is formed in one or more wells selected from the first wells of the first conductivity type so as to form a second well or wells of the first (P) or second (N) conductivity type, and a memory cell or cells are formed in one of the wells having the highest surface impurity concentration.

Thus, the basic feature of this invention is that the second conductivity type well is formed in one or more selected wells of the first conductivity type in order to partly neutralize the first conductivity type impurity (P) with the second conductivity type impurity (N), thereby providing the first conductivity type well ($P^+$) having an impurity concentration lower than the remaining first conductivity type well or wells ($P^{++}$) formed in the semiconductor body. Alternately, the basic feature of this invention is that first conductivity type impurity is further doped into one or more of the first conductivity type low impurity concentration wells (P, $p^+$) to form at least one first conductivity type well of high impurity concentration ($P^{++}$). In this way, there can be obtained three different types of first conductivity type (P) regions, that is, the semiconductor body (P) itself, the first conductivity type well ($P^{++}$) formed in the semiconductor body, and the first conductivity type well $P^+$) having the first conductivity type impurity concentration lowered by the doped second conductivity type impurity. Further, in a case where two different types of second conductivity type (N) wells are formed, or where two or more different types of first conductivity type (p) wells are formed, first conductivity type wells having more different degrees of impurity concentration can be obtained. If the structure is applied to the dynamic random access memory, it is preferable to form cells in one of the first conductivity type wells having the highest impurity concentration. This is because the leak current in the memory capacitor is required to be lowered and the soft error is required to be minimum.

Further, in this invention, it is possible to divide an ion-implantation step into a plurality of sub-steps and form a plurality of wells of variously selected degrees of impurity concentration by controlling the amount of impurity doped into each portion of the semiconductor substrate.

BRIEF DESCRIPTION OF THE DRAWINGS

FIGS. 3A to 3M are cross sectional views showing the manufacturing process in a case where a trench type DRAM and the peripheral circuit thereof are formed on an N-type substrate with well structure according to one embodiment of this invention;

FIG. 13 is a cross sectional view showing the structure of a planar cell type memory which can be applied to a DRAM utilizing this invention;

FIG. 14 is a cross sectional view showing the structure of an SRAM which can be applied to this invention; and FIGS. 15A to 15E respectively show various CMOS inverters to which the present invention can be applied.

DETAILED DESCRIPTION OF THE PREFERRED EMBODIMENTS

Figure 1:
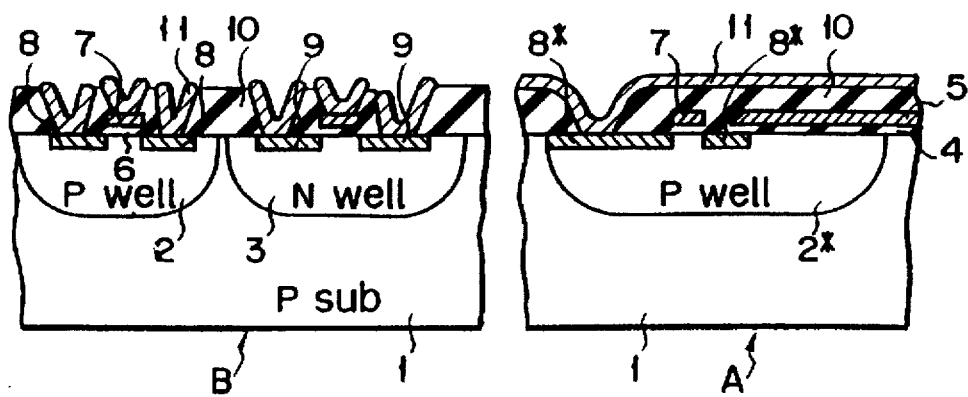
FIG. 1 is a cross sectional view of a semiconductor device with the conventional well structure.
Figure 2A:
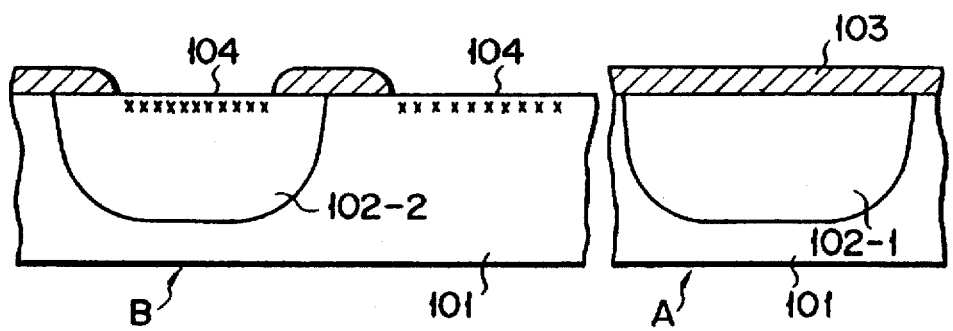
FIGS. 2A to 2C are cross sectional views showing the manufacturing process of a semiconductor device with well structure according to one embodiment of this invention.
Figure 2B:
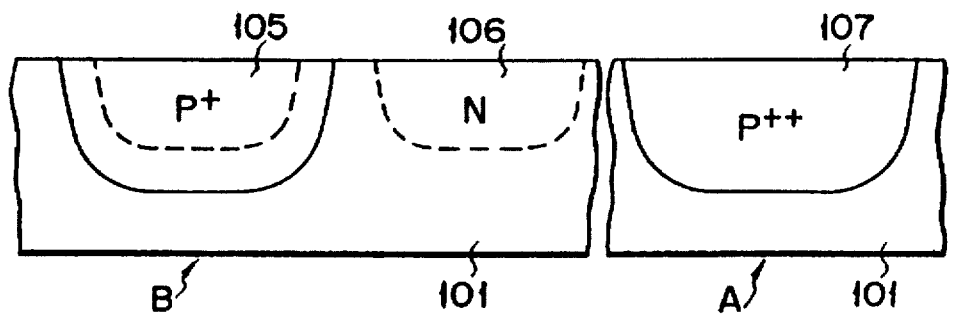

There will now be described an embodiment of this invention with reference to the drawings. First, as shown in FIG. 2A, boron is ion-implanted using the photolithographic method into that part of P-type semiconductor body 101 which is allocated for formation of first P-well region 102-! of cell area A in a dynamic RAM. In this case, the ion-implantation dosage amount is $2 \times 10^{14}$ cm$^{-2}$ and the acceleration voltage is 100 keV. At the same time, boron is also ion-implanted into that part which is allocated for formation of second P-well region 102-2 of peripheral circuit section B. After this, the semiconductor structure is subjected to a first heat treatment at a temperature of 1190° C. in an $N_2$ gas atmosphere for about 6 hours so as to form P-well regions 102-1 and 102-2. FIG. 2A shows the semiconductor structure after the heat treatment. In FIG. 2A, xxx indicates ion-implanted boron.

Next, phosphorus 104 is ion-implanted into a portion which is allocated for formation of first N-well region 106 and internal portion 105 of second P-type well 102-2 by using resist film 103 with the dose amount of $5 \times 10^{13}$ cm$^{-2}$ and at an acceleration voltage of 100 keV. After this, the semiconductor structure is subjected to a second heat treatment at a temperature of 1190° C. in an $N_2$ gas atmosphere for about 4 hours. As a result, first P-well region (P$^{++}$) 107 having a surface impurity concentration of $5 \times 10^{17}$ cm$^{-3}$ is formed in cell area A, and second P-well region P$^+$) 105 having a surface impurity concentration of $2 \times 10^{17}$ cm$^{-3}$ is formed in the N-channel region of peripheral circuit B.

Figure 2C:
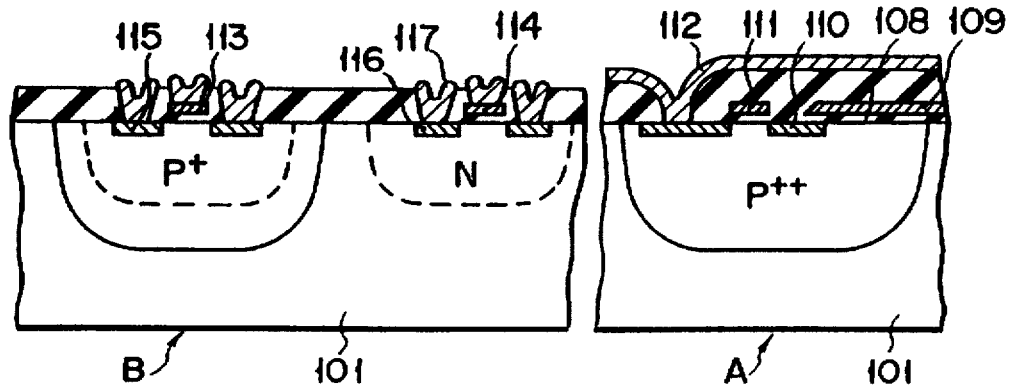

Then, capacitor insulation film 108, storage electrode (polysilicon) 109, N$^+$-type diffusion layer 110, gate electrode (polysilicon) 111 of a write-in/ readout transistor, and wiring layer (aluminum) 112 for the bit line are formed in cell area A. Further, gate electrode (polysilicon) 113 of an N-channel transistor, gate electrode (polysilicon) 114 of a P-channel transistor, diffusion regions 115 and 116, and lead-out wiring layer (aluminum) 117 for each electrode are formed in second P-well 105 and first N-well 106 of the peripheral circuit such as row/column decoders and sense amplifiers, thus forming a CMOS DRAM as shown in FIG. 2C.

FIGS. 3A to 3M are cross sectional views showing the manufacturing process used in a case where a trench type DRAM cell and the peripheral circuit thereof are formed on an N-type substrate with a well structure according to one embodiment of this invention.

As shown in FIG. 3A, resist film 303A is formed (patterning) on a predetermined portion of N-type substrate 301 covered with $SiO_2$ oxide film 302A having a thickness of about 1000 Å, and boron (P-type impurity) is ion-implanted via the openings of resist film 303A with the dose amount of $2 \times 10^{13}$ cm$^{-2}$ and at an acceleration voltage of 100 keV. As the result of the ion-implantation process, P-type impurity region 304A is formed in that portion of N-type substrate 301 which lies under the openings of resist film 303A.

Then, as shown in FIG. 3B, new resist film 303B is formed to have openings, and boron is ion-implanted via the openings of resist film 303B with the dose amount of $3 \times 10^{13}$ cm$^{-2}$ and at an acceleration voltage of 100 keV. As the result of the ion-implantation process, p-type impurity region 304B and P-type impurity region (304A+304B) are formed in N-type substrate 301 in addition to p-type impurity region 304A.

After this, resist film 303B is removed and the semiconductor structure is subjected to a heat treatment in the $N_2$ gas atmosphere at a temperature of 1190° C. for 6 hours. As a result, P-type impurity regions 304A, 304B, and (304A+304B) are thermally diffused (drive-in diffusion of P-well) to form P-well-2 having a low impurity concentration (P), P-well-3 having a mid range impurity concentration P$^+$), and P-well-1 having a high impurity concentration (P$^{++}$), as shown in FIG. 3C.

Then, as shown in FIG. 3D, new resist film 303D is formed to have openings, and phosphorus (N-type impurity) is ion-implanted via the openings of resist film 303D with the dose amount of $3 \times 10^3$ cm$^{-2}$ and at an acceleration voltage of 160 keV. As the result of the ion-implantation process, N-type impurity regions 306D are formed in N-type substrate 301 and P-well-2.

After this, resist film 303D is removed and the semiconductor structure is subjected to a heat treatment in the $N_2$ gas atmosphere at a temperature of 1190° C. for 4 hours. AS a result, N-type impurity regions 306D are thermally diffused (drive-in diffusion of N-well) to form N-well-1 and N-well-2 in N-type substrate 301 and P-well-2, respectively, as shown in FIG. 3E.

In the thermal diffusion process, N-type impurity of N-well-2 is partly neutralized by P-type impurity of P-well-2, thus setting the impurity concentration (N) of N-well-2 lower than that (N$^+$) of N-well-1.

Figure 3F:
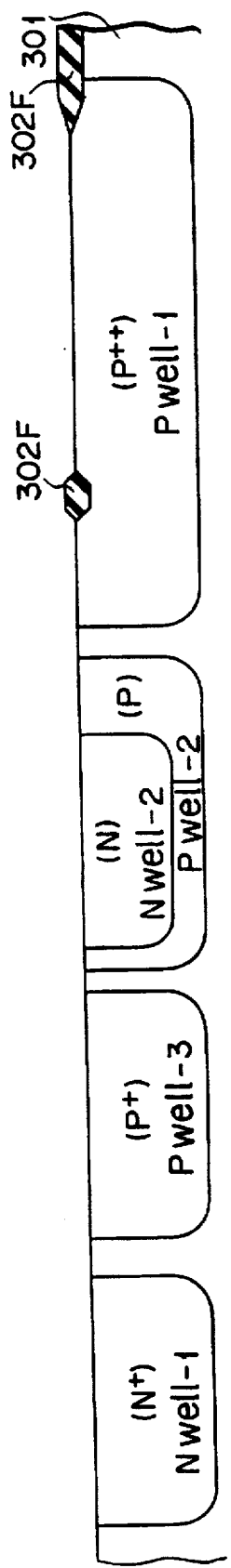
Figure 3G:
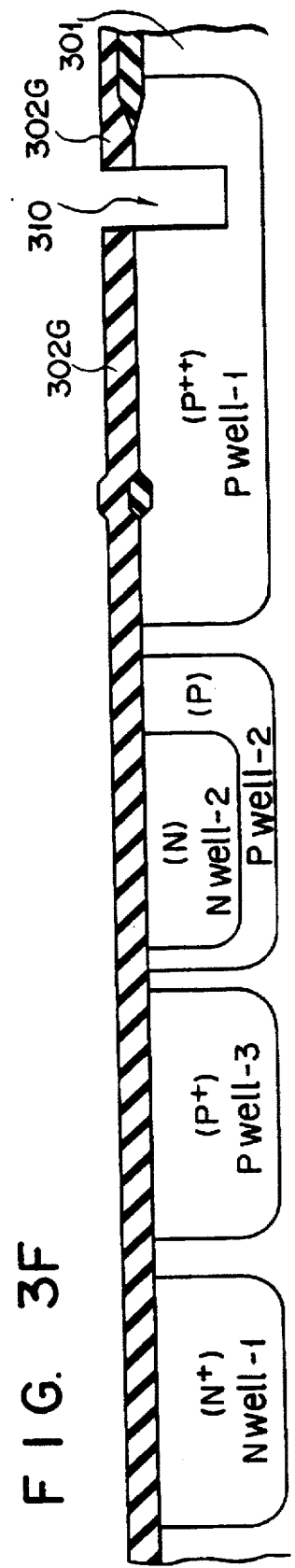

Then, oxide film 302A is removed and field oxide film 302F is formed as shown in FIG. 3F. After this, thick resist film 302G is formed on the semiconductor structure, and trench 310 for the memory cell capacitor is formed in a predetermined portion of P-well-1 by means of a reactive ion etching (RIE) method, or by use of a laser beam as shown in FIG. 3G. Thereafter, a thermal oxide film (SiO$_2$) having a thickness of about 200 Å is formed on the silicon substrate, where from the resist was removed.

Figure 3H:
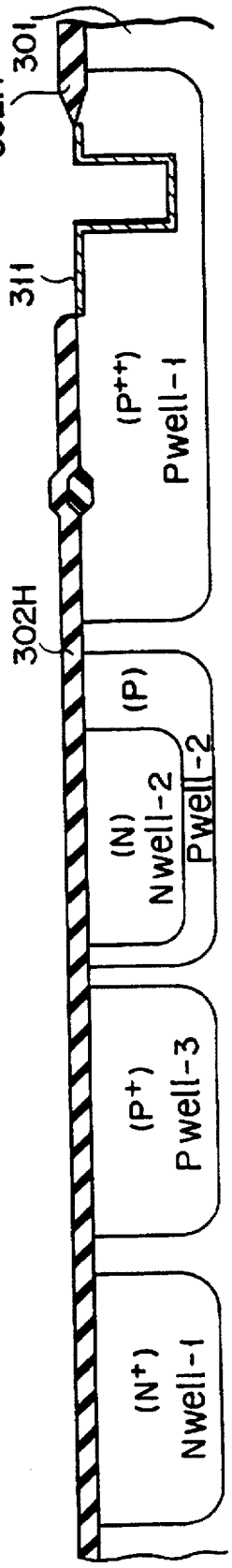

Next trench 310 and its peripheral thermal oxide film (SiO$_2$) are etched, a portion of field oxide film 302G around trench 310 is selectively removed, and a doped polysilicon layer (not shown) having an N-type impurity to be diffused into the surface area of trench 310 is formed on the semiconductor structure. Then, the semiconductor structure is subjected to a heat treatment to diffuse the N-type impurity from the doped polysilicon layer formed thereon into the surface area of trench 310, thus forming diffusion layer 311 of the capacitor electrode, as shown in FIG. 3H. The doped polysilicon layer is then removed after diffusion layer 311 has been formed.

Figure 3I:
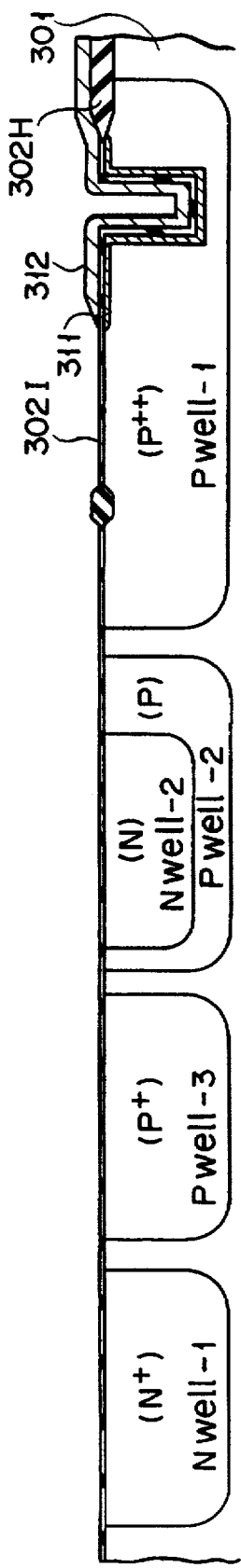

As shown in FIG. 3I, after heat oxide film 302H has been removed, extremely thin $SiO_2$ film 302I of 100 Å is formed on surface substrate 301 which has diffusion layer 311 formed therein. Oxide film 302I is used as dielectric material of the memory capacitor. Polysilicon layer 312 of the capacitor electrode is formed around and on the internal surface of trench 310, with part of dielectric oxide film 302I disposed between polysilicon layer 312 and diffusion layer 311.

Figure 3J:
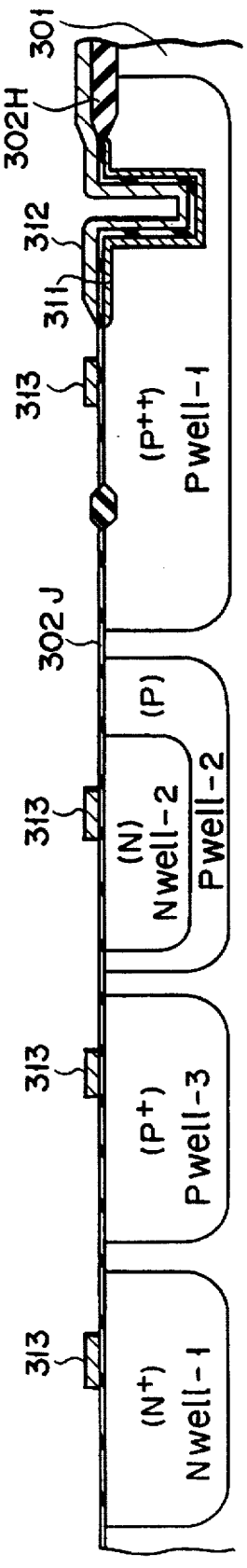

After this, the substrate surface is subjected to an oxidation process whereby oxide film 302J having a predetermined thickness (for example, 200 Å) is formed on substrate 301, and then polysilicon layer 313 to be used as a gate electrode is formed on oxide film 302J as shown in FIG. 3J.

Figure 3K:
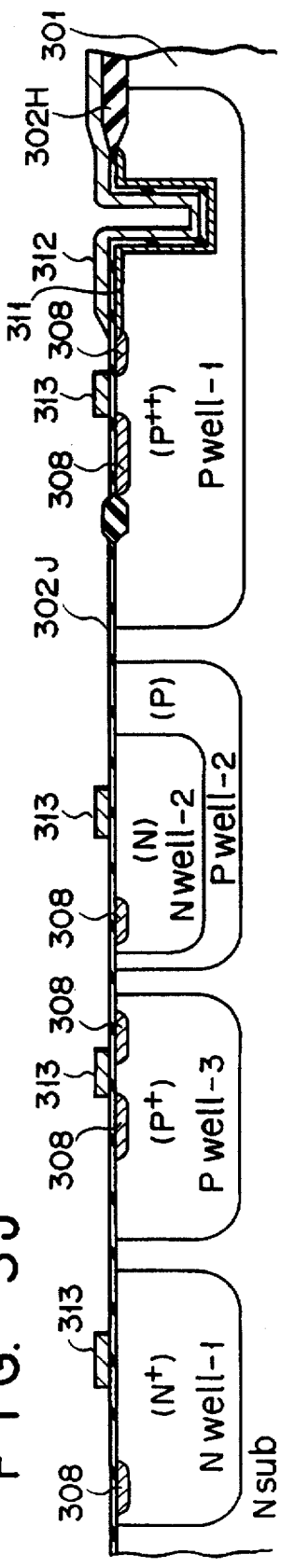

Next, N-type diffusion regions 308 which form source and drain regions are formed on both sides of respective electrodes 313 of P-well-1 and P-well-3 by use of a resist film (not shown) as shown in FIG. 3K. Further, N-type diffusion layers 308 are formed in the end portions of N-well-1 and N-well-2.

Figure 3L:
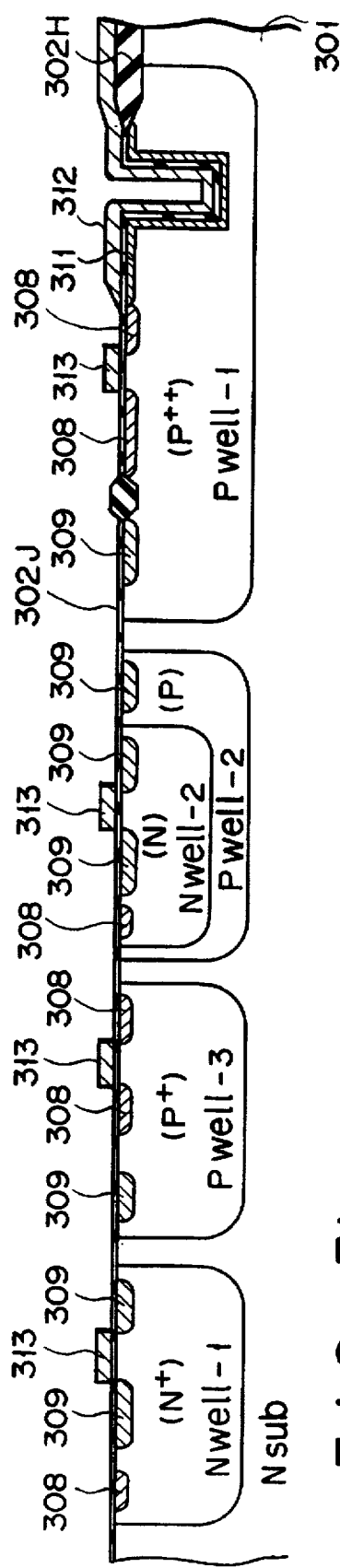

Then, as shown in FIG. 3L, P-type diffusion layers 309 are formed in the end portions of P-well-1 to P-well-3 by use of a resist film (not shown). Further, P-type diffusion regions 309 which form source and drain regions are formed on both sides of respective electrodes 313 of N-well-1 and N-well-2.

Figure 3M:
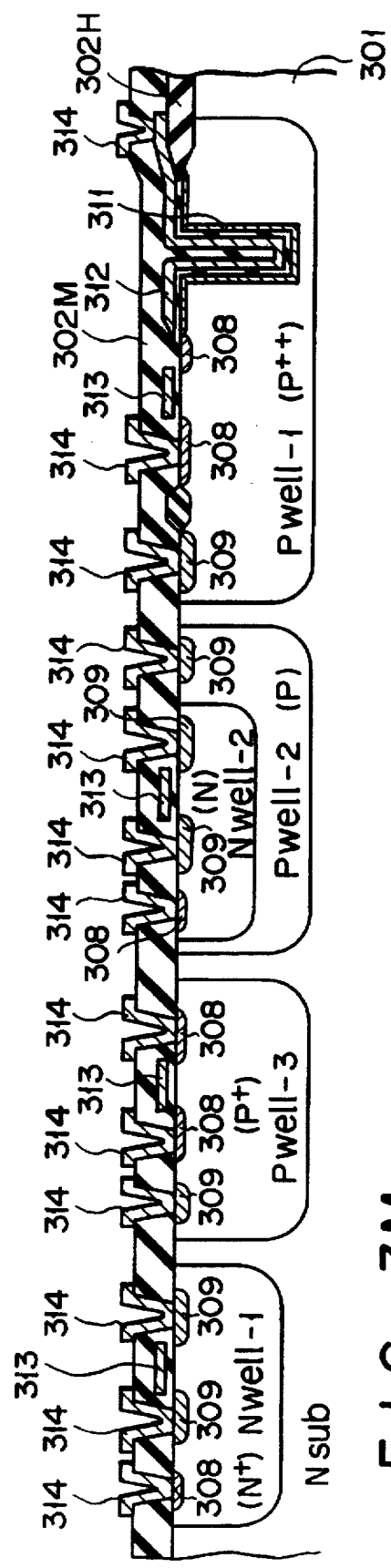

Next, as shown in FIG. 3M, thick $SiO_2$ film 302M is formed on the entire surface of substrate 301, predetermined portions of second oxide film 302M are etched out to form openings, and aluminum wiring layers 314 are selectively formed in connection with respective N-type diffusion layers 308, p-type diffusion layers 309, and capacitor electrode 312, via the openings.

In FIG. 3M, P-channel transistors, constituting a power source voltage converting circuit, input/output circuit, input protection circuit, and the like, are formed in N-well-1, and P-channel transistors, constituting a sense amplifier and the like, are formed in N-well-2. Further, memory cells, and N-channel transistors, constituting sense amplifier, word driver, and the like, are formed in that one of P-well-1 to P-well-3 which has the highest impurity concentration, that is, P-well-1. In addition, the peripheral circuit and the like are formed in P-well-2.

Since N-well-2 is isolated from N-well-1 by means of P-well-2, voltages applied to N-well-1 and N-well-2 can be set to have different voltage levels. Further, it is possible that an N-well having an impurity concentration higher than that of P-well-1 ($P^{++}$) be provided in a position which is not shown in the drawing.

Figure 4:
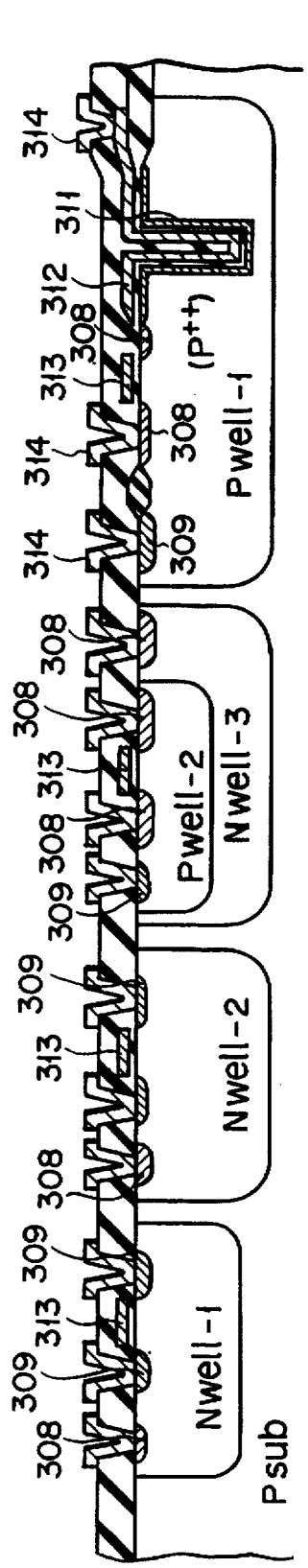
FIG. 4 is a cross sectional view showing the case in which the DRAM shown in FIG. 3M is formed in a P-type substrate.

FIG. 4 shows the case in which the DRAM shown in FIG. 3M is formed in a P-type substrate. N-well-2 is formed in P-well-2 in FIG. 3M, but P-well-2 is formed in N-well-3 in FIG. 4.

Figure 5:
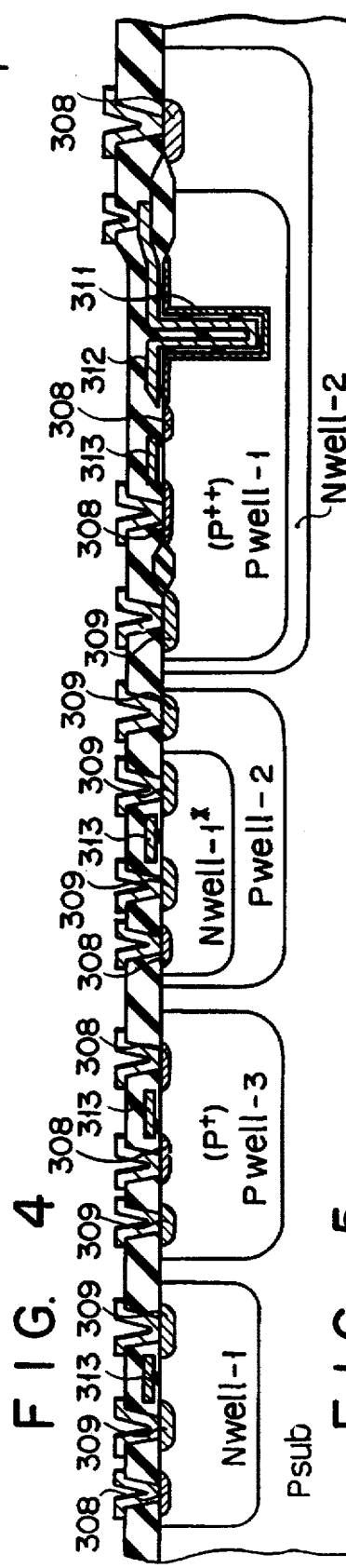
FIG. 5 is a cross sectional view of a modification of the DRAM shown in FIG. 4.

FIG. 5 is a modification of the DRAM shown in FIG. 4. In FIG. 5, P-well-1 of the memory cell is formed in N-well-2, and N-well-1*, in P-well-2 is formed in the same step as that of N-well-1, or it is formed immediately after the step of forming N-well-1.

Figure 6:
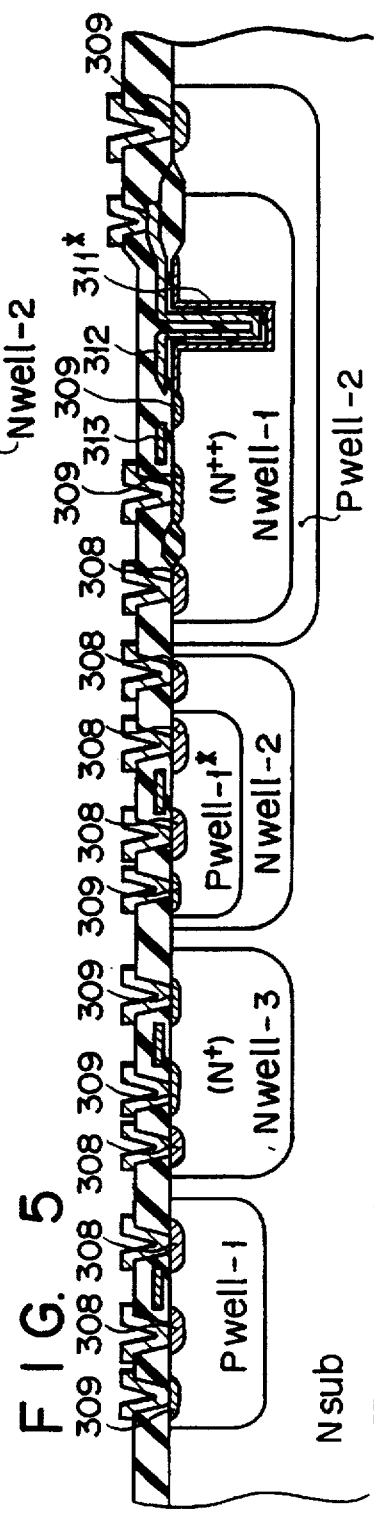
FIG. 6 is a cross sectional view showing the case in which the DRAM shown in FIG. 5 is formed in a P-type substrate.

FIG. 6 shows the case wherein the DRAM shown in FIG. 5 is formed in a P-type substrate. The structure shown in FIG. 6 is similar to that of FIG. 5 except that the impurity conductivity type is inverted from either a P-type impurity to N-type impurity or vice versa.

Figure 7:
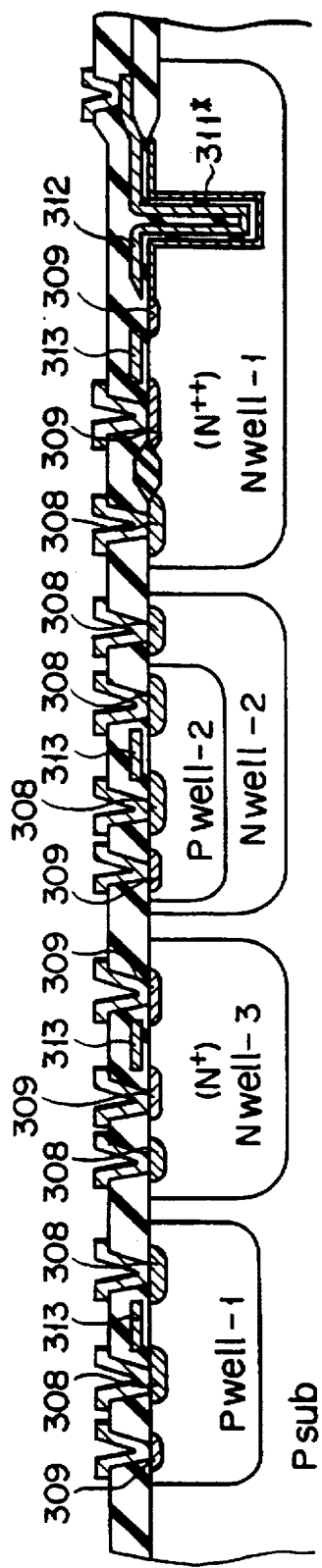
FIG. 7 is a cross sectional view of another modification of the DRAM shown in FIG. 4.

FIG. 7 is another modification of the DRAM shown in FIG. 4. In this embodiment, N-well-1 has the highest impurity concentration ($N^{++}$), and a memory cell is formed therein. The peripheral circuit of the DRAM is formed in N-well-2 which has a lower impurity concentration than N-well-1. The term "highest impurity concentration" used in this embodiment refers to N-type impurity, and therefore P-well-1 may be formed to have a P-type impurity concentration which is higher than an N-type impurity concentration of N-well-1, for example.

Figure 8:
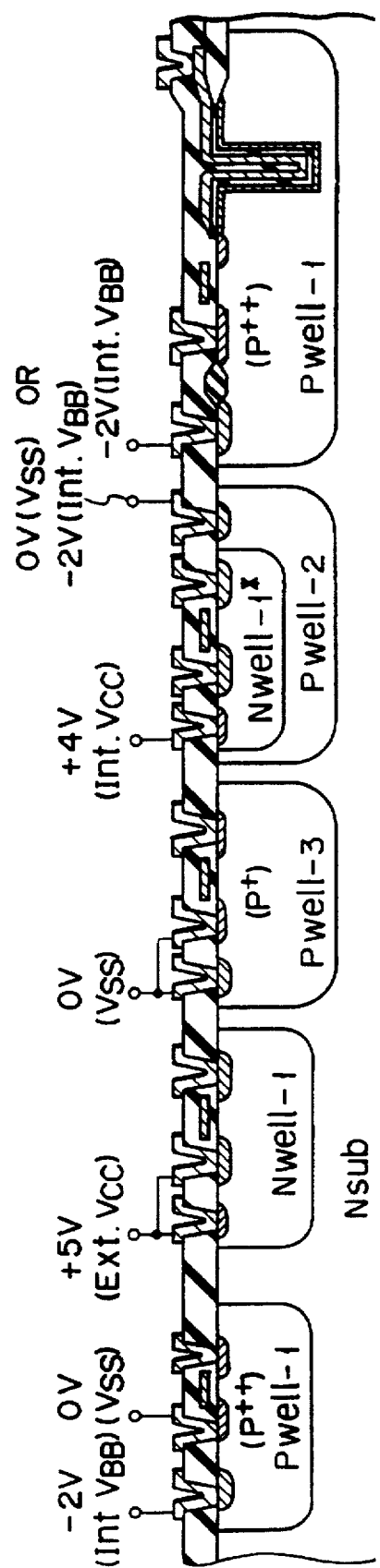
FIG. 8 is a cross sectional view of a modification of the DRAM which is shown in FIG. 3M and in which various power source voltages are applied.
Figure 9A:
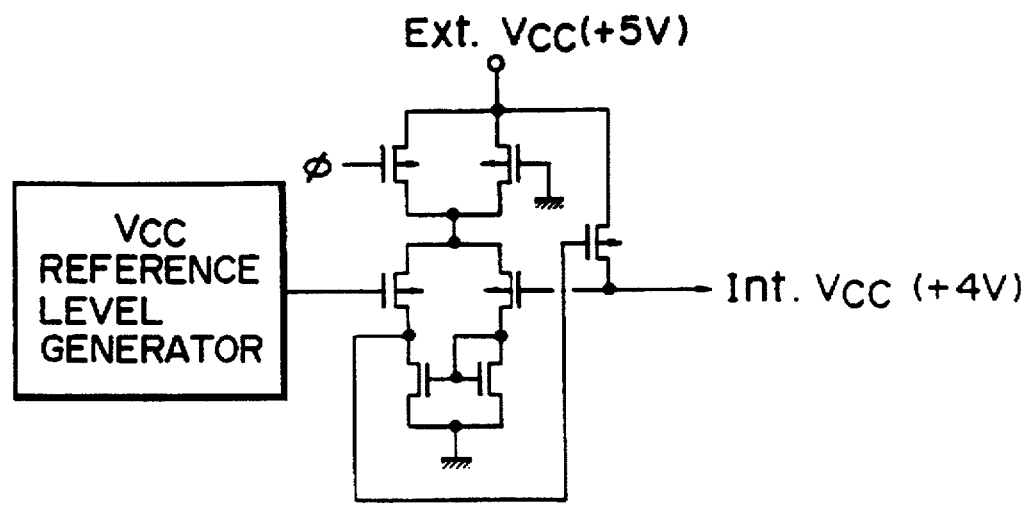
FIG. 9A shows a voltage ganerating circuit for supplying low voltage VCC to the multi-power source DRAM shown in FIG. 8.

FIG. 8 is a modification of the DRAM shown in FIG. 3M to which various power source voltages are applied. In this embodiment, external power source voltage ExtVCC (+5 V) is applied to N-well-1 wherein P-channel transistors constituting the input/output circuit and the like are formed. Internal power source voltage IntVCC (+4 V) which is derived by means of such a voltage generating circuit as shown in FIG. 9A is applied to N-well-i formed in P-well-2. With the structure shown in FIG. 8, the pn junction between N-well-1 and P-well-2 is reversely biased because of the potential difference between ExtVCC (+5 V) and IntVCC (+4 V) so that N-well-1 is electrically isolated from P-well-2. Therefore, ExtVCC (+5 V) can be applied to the input/output circuit which requires a relatively high operation voltage, while at the same time IntVCC (+4 v or less) can be applied to the internal circuit which is desirably operated at a low voltage level.

Figure 9B:
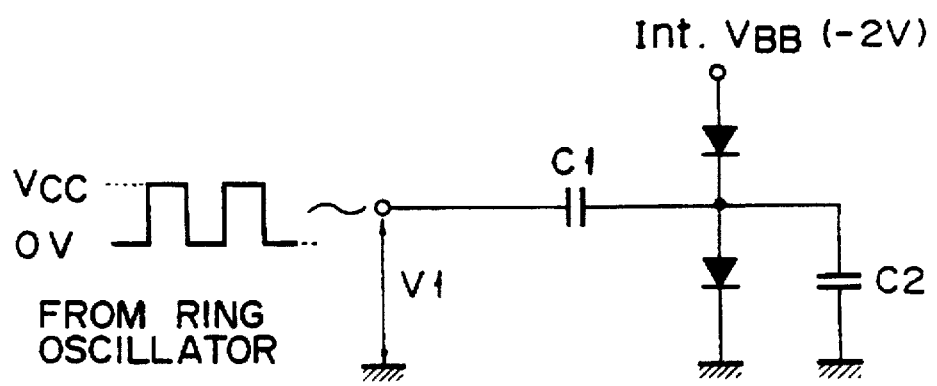
FIG. 9B shows a voltage generating circuit for supplying low voltage VBB to the multi-power source DRAM shown in FIG. 8.

Further, low negative voltage IntVBB (−2 V) which is applied to the memory cell in P-well-1, for example, can be derived from such a voltage generating circuit as shown in FIG. 9B.

Because the junction between P-well-1 and the N-type substrate is reversely biased by the potential difference between ExtVCC (+5 V) or IntVCC (+4 V) and IntVBB (−2 V), the low negative voltage IntVBB (−2 V) can thus be used. In other words, since bias voltages of various levels can be applied to the respective wells, the drain-source voltage of the transistor formed in the well can be freely set.

Incidentally, CMOS inverters shown in FIGS. 15A to 15E can be applied to the device of this invention.

The circuits shown in FIGS. 9A and 9B are disclosed in the following documents:

1986 IEEE International Solid-State Circuits Conference ISSCC 86 / FRIDAY, FEB. 21, 1986 SESSION XIX: DYNAMIC RAMs pages 272–273

Figure 10:
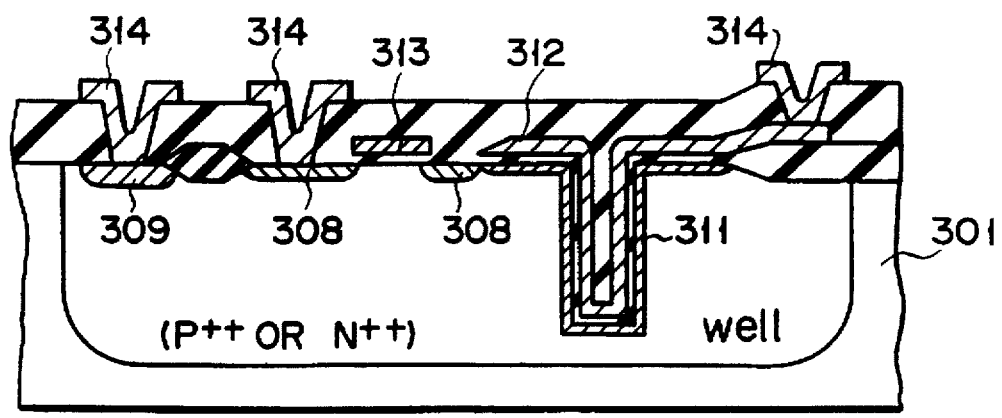
FIG. 10 is a cross sectional view showing the structure of a trench cell type memory which can be applied to a DRAM utilizing this invention.

FAM 19.7: An Experimental 4 Mb CMOS DRAM Tohru Furuyama, Takashi Ohsawa, Yoji Watanabe, Hidemi Ishiuchi, Takeshi Tanaka, Kazunori Ohuchi, Hiroyuki Tango, Kenji Natori, Osamu Ozawa Toshiba Semiconductor Device Engineering Laboratory/VLSI Research Center Kawasaki, Japan FIG. 10 shows the structure of a trench cell type memory which can be applied to a DRAM utilizing this invention. This structure is the same as that of FIG. 3M (however, the conductivity type of substrate can be P or N). Gate electrode 313 is used as a word line of the memory cell, and the aluminum wiring layer connected to diffusion region 308 which lies on the left side in FIG. 10 is used as a bit line of the memory cell.

Examples of trench type memories having structures other than those mentioned above are disclosed in the following U.S. patent specifications:

U.S. Pat. No. : 4,672,410 Miura et al., Jan. 9, 1987 "SEMI-CONDUCTOR MEMORY DEVICE WITH TRENCH SURROUNDING EACH MEMORY CELL", U.S. Pat. No. : 4,673,962 Chatterjee et al., Jan. 16, 1987, "VERTICAL DRAM CELL AND METHOD"

It should be understood that the contents disclosed in the above U.S. patent specifications are incorporated in this application.

Figure 11:
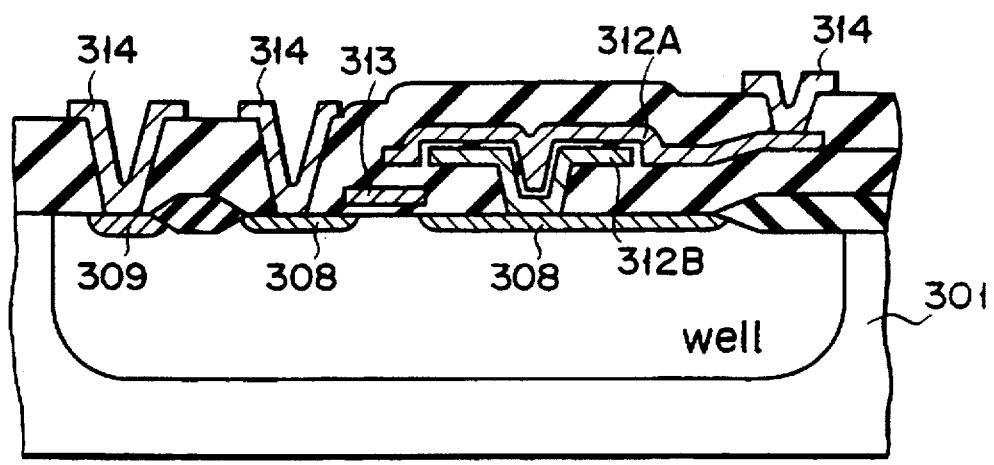
FIG. 11 is a cross sectional view showing the structure of a stacked cell type memory which can be applied to a DRAM utilizing this invention.

FIG. 11 shows the structure of a stacked cell type memory which can be applied to a DRAM utilizing this invention. In the stacked cell type memory, a memory capacitor is constituted by concave pot type polysilicon storage node 322B and convex capacitor electrode 312A which is engaged with a concave portion of storage node 312B, via an oxide film (dielectric material), with a thickness of several tens Å.

Figure 12:
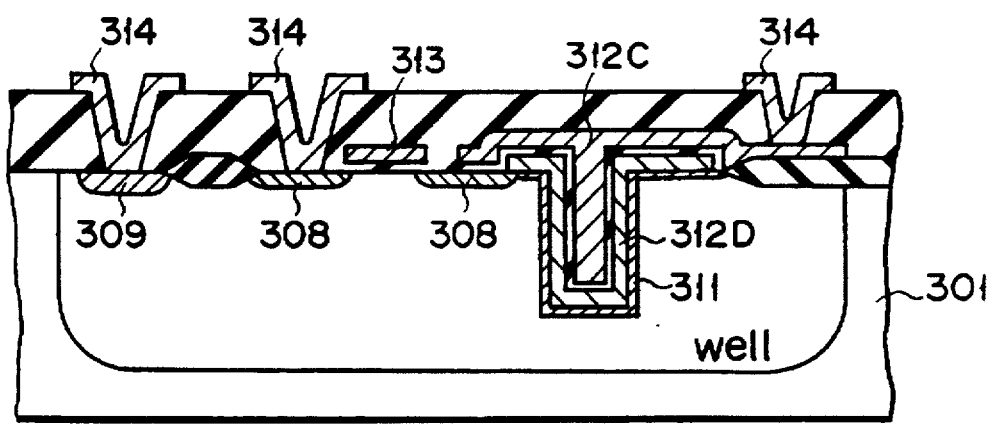
FIG. 12 is a cross sectional view showing the structure of a stacked trench (STT) cell type memory which can be applied to a DRAM utilizing this invention.

FIG. 12 shows the structure of a stacked trench (STT) cell type memory which can be applied to a DRAM utilizing this invention. The STT structure can be attained by applying the stacked cell structure of FIG. 11 to the trench structure of FIG. 10. The STT structure used in this invention is suitable for DRAMs of a large memory capacity, for example, 16M bits.

FIG. 13 shows the structure of a planar cell type memory which can be applied to a DRAM utilizing this invention. This structure corresponds to the cell structure in area A of FIG. 2C.

FIG. 14 shows the structure of an SRAM which can be applied to this invention. In this embodiment, the drain wiring layer of the cell transistor is formed in the form of two-layered structure having first polysilicon layer (for internal wiring layer) 312F of low resistance and second polysilicon layer (for load resistor) 312G of high resistance.

The Bipolar-CMOS technology disclosed in the following documents can be applied as the conventional memory cell technology which can be used in this invention:

IEEE JOURNAL OF SOLID-STATE CIRCUITS, VOL. SC-22, NO. 5, OCT. 1987,

"An Experimental 1 -Mbit BiCMOS DRAM" pages 657–662, GORO KITSUKAWA, RYOICHI HORI, YOSHIKI KAWAJIRI, TAKAO WATANABE, TAKAYUKI KAWAHARA, KIYOO ITOH, YUTAKA KOBAYASHI, MASAYUKI OOHAYASHI, KYOICHIRO ASAYAMA, TAKAHIDE IKEDA, AND HIROSHI KAWAMOTO 408 -IEDM86, "Advanced BiCMOS Technology for High Speed VLSI" pages 408–411, T. Ikeda*, T. Nagano, N. Momma, K. Miyata, H. Higuchi**, M. Odaka, K. Ogiue* Hitachi Research Laboratory, 4029, Kuji-cho, Hitachi-shi, Ibaraki, 319–12, Japan

* Device Development Center, 2326, Imai-cho, Oume-shi, Tokyo, 198, Japan
** Central Research Laboratory, Kokubunji-shi, Tokyo, 185, Japan Hitachi Ltd.

802 -IEDM86, "Bipolar CMOS merged structure for high speed M bit DRAM" pages 802–804, Y. Kobayashi, M. Oohayashi, K. Asayama, T. Ikeda* R. Hori and K. Itoh Hitachi Research Laboratory, Hitachi, Ltd., Hitachi, Ibaraki, Japan, 319–12

* Device Development Center, Hitachi, Ltd., Oume, Tokyo, Japan 198
** Central Research Laboratory, Hitachi, Ltd., Kokubunji, Tokyo, Japan 185

Bipolar devices, which appear to be similar to but are substantially different from the semiconductor device of this invention, are disclosed in the following documents:

Physics and Technology of Semiconductor Devices, page 209, A. S. GROVE, Fairchild Semiconductor, Palo Alto University of California., Berkeley, John Wiley and Sons, Inc., New York• London• Sydney Physics of Semiconductor Devices SECOND EDITION pages 192–197, S. M. Sze, Bell Laboratories, Incorporated Murray Hill, N.J., A WILEY-INTERSCIENCE PUBLICATION JOHN WILEY & SONS, New York • Chichester • Brisbane • Toronto • Singapore In general, the bipolar device includes high impurity concentration regions and low impurity concentration regions, but they are substantially different from the well of high impurity concentration ($P^{++}$) and the wells of lower impurity concentration (P+, P) of this invention. More specifically, an active circuit element such as a memory cell is formed in the high impurity concentration ($P^{++}$) well in this invention, but in the bipolar device, the high impurity concentration region (for example, emitter) is used as part of the active circuit element. It should be understood that the structure of this invention (combination of the high and low impurity concentration wells) is essentially different from that of the bipolar device (combination of low and high impurity concentration regions such as the emitter and collector).

This invention is not limited to the embodiments described above, and can be variously modified. For example, in the embodiment of FIG. 2C, a P-well of low impurity concentration is formed in peripheral circuit section B by using opposite conductivity type (p-type against N-type, for example) impurity. However, it is possible to form a P-well of high impurity concentration in cell section A by using the same conductivity type (P-type for P-type, for example) impurity to enhance the impurity concentration of the well. Further, in the embodiment, first N-well is formed in the first P-well to form the second P-well with impurity concentration lower than that of the first P-well. However, it is also possible to form low and high impurity concentration N-wells by forming a first N-well with impurity concentration higher than that of the first P-well in the first P-well.

As described above, according to this invention, wells with various degrees of impurity concentration can be easily formed, and therefore the wells can be selectively used to attain desired elements. In the DRAM or the like, a cell or cells can be formed in the well of the highest impurity concentration and the peripheral circuit section can be formed in the well with the impurity concentration next to the highest impurity concentration, thus making it possible to significantly improve the performance and characteristics of the semiconductor device.

What is claimed is:

1. A semiconductor memory comprising:

a P-type substrate;

an N-type region formed in said substrate;

a first P-type region formed in said N-type region;

a memory cell structure formed in said first P-type region and including memory cell source and drain regions, a memory cell gate electrode, and a memory cell capacitor electrode;

a region containing a transistor structure formed in said substrate adjacent to said memory cell structure, said transistor structure including transistor source and drain regions, and a transistor gate electrode;

a second P-type region formed in said substrate, said second P-type region being located between said memory cell structure and said transistor structure, wherein a surface impurity concentration of said first P-type region is higher than surface impurity concentrations of said substrate and said second P-type region; and means for supplying a predetermined potential to said N-type region.

2. A semiconductor memory comprising:

an N-type substrate;

a P-type region formed in said substrate;

a first N-type region formed in said P-type region;

a memory cell structure formed in said N-type region and including memory cell source and drain regions, a memory cell gate electrode, and a memory cell capacitor electrode;

a region containing a transistor structure formed in said substrate adjacent to said memory cell structure, said transistor structure including transistor source and drain regions, and a transistor gate electrode;

a second N-type region formed in said substrate, said second N-type region being located between said memory cell structure and said transistor structure, wherein a surface impurity concentration of said first N-type region is higher than surface impurity concentrations of said substrate and said second N-type region; and means for supplying a predetermined potential to said first N-type region.

3. A semiconductor memory comprising:

a P-type substrate;

a well region formed in said substrate;

a P-type memory cell region, containing a memory cell structure, formed in a first part of said well region, said memory cell structure including memory cell source and drain regions, a memory cell gate electrode, and a memory cell capacitor electrode;

a P-type transistor structure formed in a second part of said well region and including transistor source and drain regions, and a transistor gate electrode;

an N-type region formed in a third part of said well region, said N-type region being located between said memory cell region and said P-type transistor structure, wherein a surface impurity concentration of said memory cell region is higher than surface impurity concentrations of said P-type substrate and said P-type transistor structure; and means for supplying a predetermined potential to both said memory cell region and said third part of said well region.

4. A semiconductor memory comprising:

a P-type substrate;

a P-type memory cell region containing a memory cell structure, said memory cell structure including memory cell source and drain regions, a memory cell gate electrode, and a memory cell capacitor electrode;

an N-type region containing a transistor structure formed in said substrate, said transistor structure including transistor source and drain regions, and a transistor gate electrode;

a P-type region formed in said substrate, said P-type region being located between said P-type memory cell region and said transistor structure, wherein a surface impurity concentration of said P-type region is higher than surface impurity concentrations of said P-type substrate and said P-type memory cell region; and means for supplying a predetermined potential to both said P-type memory cell region and said P-type region.

5. A semiconductor memory comprising:

a substrate;

a well region formed in said substrate;

a P-type memory cell region, containing a trench cell type memory cell structure, formed in a first part of said well region, said memory cell structure including memory cell source and drain regions, a memory cell gate electrode, and a memory cell capacitor electrode;

a P-type transistor structure formed in a second part of said well region and including transistor source and drain regions, and a transistor gate electrode; and an N-type region formed in a third part of said well region, said N-type region being located between said memory cell region and said transistor structure, wherein a surface impurity concentration of said P-type memory cell region is higher than a surface impurity concentration of said substrate.

6. A semiconductor memory comprising:

a P-type substrate;

a well region formed in said substrate;

a P-type memory cell region, containing a stacked trench cell type memory cell structure, formed in a first part of said well region, said memory cell structure comprising a trench formed by polysilicon and containing insulation film, memory cell source and drain regions, a memory cell gate electrode, and an elongated memory cell capacitor electrode, wherein said elongated memory cell capacitor electrode extends into said trench;

a P-type transistor structure formed in a second part of said well region and including transistor source and drain regions, and a transistor gate electrode; and an N-type region formed in a third part of said well region, said N-type region being located between said P-type memory cell region and said transistor structure, wherein a surface impurity concentration of said P-type memory cell region is higher than a surface impurity concentration of said P-type substrate.

7. A semiconductor memory comprising:

a P-type substrate;

an N-type region formed in said substrate;

a first P-type region formed in said N-type region;

a memory cell structure formed in said first P-type region and including memory cell source and drain regions, a memory cell gate electrode, and a memory cell capacitor electrode;

a region containing a transistor structure formed in said substrate adjacent to said memory cell structure, said transistor structure including transistor source and drain regions, and a transistor gate electrode;

a second P-type region formed in said substrate and being located between said memory cell structure and said transistor structure, wherein a surface impurity concentration of said first P-type region is higher than surface impurity concentrations of said P-type substrate and said second P type region, and the surface impurity concentration of said second P-type region is higher than the surface impurity concentration of said P-type substrate; and means for supplying a predetermined potential to said N-type region.

8. A semiconductor memory comprising:

a P-type substrate;

a first P-type region formed in said substrate;

a memory cell structure formed in said first P-type region and including memory cell source and drain regions, a memory cell gate electrode, and a memory cell capacitor electrode;

a region containing a transistor structure formed in said substrate adjacent to said memory cell structure, said transistor structure including transistor source and drain regions, and a transistor gate electrode;

a second P-type region formed in an N-type region, said second P-type, region being located between said memory cell structure and said transistor structure, wherein a surface impurity concentration of said first P-type region is higher than surface impurity concentrations of said P-type substrate and said second P-type region; and means for supplying a predetermined potential to said transistor structure and said first and second P-type regions.

9. A semiconductor memory comprising:

a P-type substrate;

an N-type region formed in said substrate;

a first P-type region formed in said N-type region;

a memory cell structure formed in said first P type region and including memory cell source and drain regions, a memory cell gate electrode, and a memory cell capacitor electrode; and a second P-type region containing a transistor structure formed in said substrate adjacent to said memory cell structure, said transistor structure including transistor source and drain regions, and a transistor gate electrode, wherein a surface impurity concentration of said first P-type region is higher than surface impurity concentrations of said P-type substrate and said second P-type region.

10. A semiconductor memory as recited in claim 9, further comprising means for supplying a predetermined potential to said N-type region and said first P-type region.

* * * * *